(12) United States Patent
Yang et al.

(10) Patent No.: US 11,554,541 B2
(45) Date of Patent: Jan. 17, 2023

(54) METHOD FOR A PHOTON INDUCED MATERIAL DEPOSITION AND A DEVICE THEREFOR

(71) Applicant: The Chinese University of Hong Kong, New Territories (HK)

(72) Inventors: Sen Yang, Shatin (HK); Kangwei Xia, Shanghai (CN); Siu Fai Hung, New Territories (HK); Yifan Chen, New Territories (HK)

(73) Assignee: The Chinese University of Hong Kong, Hong Kong (HK)

( * ) Notice: Subject to any disclaimer, the term of this patent is extended or adjusted under 35 U.S.C. 154(b) by 82 days.

(21) Appl. No.: 17/123,923

(22) Filed: Dec. 16, 2020

(65) Prior Publication Data
US 2021/0187828 A1    Jun. 24, 2021

(30) Foreign Application Priority Data
Dec. 20, 2019   (EP) .................................... 19218640

(51) Int. Cl.
| | |
|---|---|
| *B29C 64/135* | (2017.01) |
| *B33Y 10/00* | (2015.01) |
| *B33Y 30/00* | (2015.01) |
| *B33Y 80/00* | (2015.01) |
| *B29C 64/273* | (2017.01) |
| *H01L 21/02* | (2006.01) |

(52) U.S. Cl.
CPC .......... *B29C 64/135* (2017.08); *B29C 64/273* (2017.08); *B33Y 10/00* (2014.12); *B33Y 30/00* (2014.12); *B33Y 80/00* (2014.12); *H01L 21/02628* (2013.01)

(58) Field of Classification Search
None
See application file for complete search history.

(56) References Cited

U.S. PATENT DOCUMENTS

| | | | |
|---|---|---|---|
| 9,555,583 B1* | 1/2017 | Dirk ..................... | A61N 1/0551 |
| 2017/0267533 A1* | 9/2017 | Yan ........................ | B33Y 10/00 |
| 2017/0346129 A1* | 11/2017 | Stolyarov ........... | H01M 10/058 |

FOREIGN PATENT DOCUMENTS

DE    20 2015 1 03 801 U1    9/2015

* cited by examiner

*Primary Examiner* — Yung-Sheng M Tsui
(74) *Attorney, Agent, or Firm* — Maginot, Moore & Beck LLP (57) ABSTRACT

A method for photon induced material deposition includes providing a first solution, which contains metallate or metal ions, providing a second solution, which contains light sensitive reducing agent, such as semiconductor nanoparticles, mixing the first solution and the second solution to form a reagent on a substrate, and focusing a light source on the reagent to form a mechanically rigid deposition in the focus of the light source.

15 Claims, 7 Drawing Sheets

METHOD FOR A PHOTON INDUCED MATERIAL DEPOSITION AND A DEVICE THEREFOR

This application claims priority under 35 U.S.C. § 119 to patent application no. EP 19 218 640.1, filed on Dec. 20, 2019 in Europe, the disclosure of which is incorporated herein by reference in its entirety.

The disclosure concerns a method for a photon induced material deposition and a corresponding device. Further, the disclosure concerns a method for a photon induced material processing and a corresponding device.

BACKGROUND

Patterned material deposition is one of the foundations of modern science and technology. Currently there are many patterning techniques. They are mainly summarized to the following six types: Fused deposition modeling (FDM), polyJet printing, direct ink writing (DIW), stereolithography (SLA)/digital light processing (DLP), selective laser sintering (SLS), and direct laser writing (DLW).

FDM, the common method in 3D printing, is based on the melting of polymer and is simple to use. However, it suffers from low resolution, large roughness, and lack of complexity. The PolyJet is based on material jetting, where liquid photopolymers are dropped and cured with UV light. It is able to do multi-material deposition with selected materials and good spatial resolution. However, the quality of metal deposition is far away from the bulk. Also the cost of the machine is high. DIW creates depositions by taking advantage of the high viscosity of the ink. But the deposited materials are mainly limited to polymer based materials, that have low resolution and are relatively fragile. SLA/DLP cures the polymer with light to form the structures. The method requires resin, resulting in the limitation of the material that can be applied. SLS uses high power laser to sinter material particles to form structures. However, it has issues like large roughness, limited materials to be used and the high costs of the device which requires high power lasers. Furthermore, most of these methods can only go down to sub-mm resolutions and the machines are expensive and specialized.

Most commonly used method is the DLW. It is the patterning of photoresist or photocurable polymer. It has high resolution and no need for additional support. However, the cost of the device, photoresist etc., is high, the material is limited to only polymer basis. If different materials are needed, material evaporation/sputtering, plating/lift-off are required. There are many new methods in the developing stages. As mentioned in the previous section, there are chemical based methods or using heating to create metal nanoparticles. By combining them with methods like optical trapping or heat annealing, people create micron size structures. But without good binding methods, it is hard to create macroscopic metal structures that can compete with the traditional lithography in properties. The state of arts in these fields were demonstrated recently in two works: direct optical deposit inorganic nanomaterials via photo-chemistry reaction and then anneal the finished structure. However, the thickness of layers can only be as thick as 100 nm due to the limited penetration depth. In the other work, scaffold of hydrogel was made, functional materials were attached, then the frame was dehydrated, and what left-out was the deposition. In both methods, complex chemistry treatment/synthesizing and multi-step preparation and development are needed. It is still far from being single step fabrication. Also, there are few practical applications demonstrated with these methods.

Current techniques of patterned material processing mainly depend on the photolithography method. Particularly, current techniques require separate steps for patterning and material deposition. Moreover, the complexity and harsh working conditions such as high temperature and vacuum in deposition or ultra-fast pulsed laser and various chemicals needed in photolithograph lead to serious limitations for fabrication. Specifically, the complexity and harsh working conditions not only increase the costs in time, money and environment, but also put extra requirements in the design, sample, working space and manpower.

Conventional fabrication processes, ranging from circuit board printing down to integrated circuit and nano-devices fabrication, consist of multiple steps such as mask fabrication, material deposition and photolithography. Not only does each step add cost and chance to fail, it puts demanding requirements. For example, the sample surface temperature can be heated up too high during electron beam evaporation. Organic chemicals used in the photolithography process put limitations on the sample to use. Especially during lift-off, which is not trivial, faults lead to a waste of efforts and materials. And due to the complication of these procedures, advanced equipment and intensive training are required. All these factors greatly limit the spread of the technology as well as the in-field deployments.

One of the key challenges is to find a mechanism to pattern the materials while depositing them in-situ. The mechanism has to be general enough that it can be applied to commonly used materials. One of the most mature deposition techniques so far is 3D-printing. Such a 3D-printer is for example disclosed by DE 20 2015 103 801 U1.

But patterning by physical form changes, such as melting and solidification, prevents the fabrication with high resolution and with materials like noble metals in small scales. Laser induced polymerization either by single photon process or by two-photon absorption can provide good resolution, but the available materials are limited and a high power ultrafast laser is required for the two-photon method.

Therefore, there is a need of a method that solves these disadvantages.

SUMMARY

This task is solved by a method comprising the following steps:

providing a first solution, which contains metallate or metal ions, providing a second solution, which contains semiconductor nanoparticles, mixing the first solution and the second solution to form a reagent on a substrate and focusing a light source on the reagent to form a mechanically rigid deposition in the focus of the light source.

The first solution and the second solution can be mixed together to a reagent and the reagent can afterwards be applied to the substrate. But it is also thinkable to apply first one of the two solutions to the substrate and then add the other solution so that the mixture of the two solutions is realized directly on the substrate.

The reagent of this method consists of two water based solutions. The first solution contains manly metallate and the second solution contains mainly light sensitive reducing agent, for example semiconductor nanoparticles.

Metallate is any complex anion containing a metal bound to several atoms or small groups.

The light source can be a laser, a LED lamp or simply a common light bulb. The laser can be a continuous wave (CW) laser or a pulsed laser. The wavelength of the laser frequency is preferentially in the visible range. Further preferred the frequency is 532 nm.

This photon induced material deposition method is based on the combination of the photon-induced chemical reduction process and light-induced optical trapping.

When light is focused on the reagent, free electrons, excited from the valence band of the light sensitive reducing agent, like semiconductor nanoparticle, by photons, trigger a chemical reduction process, which converts metal ions in the solution to metal particles on the surface of the semiconductor nanoparticle. Simultaneously, the focused light beam also works as an optical trap driving particles towards the focus spot on the substrate surface. With the combination of these two mechanisms, the chemically-reduced metal growing on the surface of the particles works like a glue, bonding trapped particles together to form a mechanically rigid deposition on the substrate surface or on a layer of already deposited material (for 3D-pattern).

The power of the light respectively the laser can be kept low, 100 mW at maximum. The power is preferentially in the range of tens of mW and can even be less than 10 mW. In contrast common 3D laser writing methods require a high power ultrafast laser.

The first solution can contain gold(III) chloride hydrochloride ($HAuCl_4$), zinc chloride ($ZnCl_2$), nickel chloride ($NiCl_2$), chloroplatinic acid ($H_2PtCl_6$), silver nitrate ($AgNO_3$) and/or iron(III) chloride ($FeCl_3$) particles or any other metallate or metal ions particle.

Based on the material to be deposited, corresponding particles of the first solution can be chosen. Materials as commonly used noble metals, including gold, silver and platinum are thinkable, which are good conductors. The deposition of transition metals is also possible.

Nobel metals are widely used as electrodes and wires in real applications due to their excellent conductance. So, it is possible to produce electrical circuits, by deposition of conductive material. This can be easily adapted to make an ink-jet laser printer for various materials. This would make the print-out of electrical circuits in the field possible.

With the inventive method, not only conductors, but also insulators can be deposited. One approach is to use iron based metallate in the first solution. Iron is so chemically active that even by using oxygen-reduced solution, the deposition ends up as iron oxide instead of pure iron. It turns out to be a good insulator.

The second solution can contain reduced graphene oxide and/or carbon ink particles or any other semiconductor nanoparticles.

The second solution works as the reducing agent for the chemical reduction process. In general, all nanoparticles with a small band gap can work. Carbon based nanoparticles, for example, are a good choice. Since the particles are required to mix with water based metallate solution, it is better to have them dispersed uniformly in water. Reduced graphene oxide fulfils these requirements and performs well. Usual carbon ink originally designed for fountain pens can be used, too. These ink particles not only are dispersed uniformly inside water, but have nearly identical hydrodynamic diameters down to 100 nm. Therefore, the best performance can be achieved by using this off-the-shelf carbon ink. This reduce the costs of the fabrication of the second solution and thus the total costs.

The substrate can be glass, quartz, sapphire, indium tin oxide or polyimide tape. Other materials are also thinkable.

The focus of the light source can be moved across the substrate and/or can be moved away from the substrate to form a two- or three-dimensional deposition. By moving the focus away from the substrate (in vertical direction), 3D material deposition can be done in the layer by layer manner.

After forming a deposition the method can be repeated, wherein the first solution can be replaced by a third solution, which contains metallate or metal ions, which are different from the metallate or metal ions of the first solution, and/or the second solution can be replaced by a fourth solution, which contains light sensitive reducing agent such as semiconductor nanoparticles, which are different from the light sensitive reducing agent such as semiconductor nanoparticles of the second solution. In this way, patterns with two different materials can be realized. It is thinkable to deposit even more than two different materials by repeating the method with different solutions again and again.

In between two depositions, the reagent is changed without removing the substrate from the set up. Thus, the alignment can be kept within the set up optical resolution. Further, by employing microfluidic chips with multiple channels, depositions with different materials can be simplified further and automated.

After forming a deposition, the residue reagent can be removed, for example by a pipette. The substrate can be cleaned with water. All the residue reagent can be recycled to minimize material waste and pollution. Moreover, unlike photolithography method, there is no organic photoresist or solvent involved in this method, which is good to the environment.

After forming a deposition, the deposited material can be sintered or annealed to improve its properties. This can be done in air with the same laser. For example, the conductance of platinum wire deposited on a glass substrate can be improved by sintering afterwards.

The light source can be focused by the means of a lens, an air objective lens, an oil objective lens and/or water objective lens. It is thinkable to focus the light by other optical means or devices. The possibility of using different optical devices makes the method very versatile.

The deposited material can be ablated via laser excitation. The combination of the ablation and the deposition leads to a re-writable material chip. This includes fully re-writable analog devices, re-writable patterning, etc.

The light of the light source can be guided to the reagent via free space, via at least one waveguide, via at least one optical fiber or via any other optical device. Depending on the external conditions and desired requirements, a very stable and flexible set up can be achieved in this way.

The reagent can be applied by drop-casting, by spin-coating, by spraying, or by microfluidic channels. The reagent can also simply applied manually by a pipette, for example.

Further, the above task is solved by a corresponding device.

In addition, proposed a method for a photon induced material processing comprising the following steps:
providing a first solution, which contains photoacid, metallate or metal ions,
providing a second suspension, which contains light sensitive reducing agent such as semiconductor particles,
mixing the first solution and the second suspension to form a reagent on a substrate, and focusing a light source on the reagent to either form a mechanically rigid deposition in the focus of the light source or etch the materials.

This photon induced material processing method is based on the combination of the photon-induced chemical reaction process and light-induced optical trapping. Solution insolvable semiconductor combines both processes together.

The first solution and the second suspension can be mixed together to a reagent and the reagent can afterwards be applied to the substrate. But it is also thinkable to apply first one of the first solution and the second suspension to the substrate and then add the other solution so that the mixture of the first solution and the second suspension is realized directly on the substrate.

The solution can be either water based or polarizing-organic solvent based.

The first solution may contain photoacid generators (PAGs) and photoacids (PAHs).

The second suspension may contain reduced graphene oxide and/or quantum dots and/or carbon ink particles.

The formed deposition may be a solid and rigid composite made of semiconductor particles and inorganic material.

After forming a deposition, the deposited material can be sintered or annealed to improve its mechanical and/or electronic properties.

The light source also may be focused by the means of a water immersion objective lens.

Particularly, the deposited material can be ablated via laser excitation without agents.

The light from the light source can be guided to the reagent via free space, and/or via at least photonic waveguide and/or via at least one optical fiber and/or via evanescent coupling.

The reagent can be applied by drop-casting, and/or by spin-coating, and/or by spraying, and/or by microfluidic channels, and/or by ink injections.

By inducing decomposition solution on the semiconductor particle after the deposition, the deposition with pure materials can be created.

The method can be used for making electronics, fabricating flexible devices and/or quantum devices, and/or photonic structures, and/or repairing broken pad and circuits, especially in a way to print with a printer.

The skilled person in the art may understand that the above features can be combined with each other, unless it is impossible technically.

The above method is a huge step forward from DLW. Especially, since it covers the deposition of inorganic materials which are the weak area of the traditional DLW methods. From the mechanism point of view, the nanoparticle trapped by optical force works as the anchor for starting the deposition, and it also works as the agent for triggering the photon induced reduction reaction to glue particles and grow them into rigid structure. Thus, it solves problems existing in other methods. The deposition has electronic qualities similar to bulk metals and is elastic and flexible like Nylon. It is able to deposit multi-material with precise spatial accuracy. It can have a spatial resolution around 500 nm and the whole structure size can be beyond centimeters (no limitation in the maximum size in principle); it can deposit easily several microns thick layers, which is tricky for some other methods. It is a method with low working temperature and can be organic free. Thus, it can be applied to organic substrates, and is well suited for flexible devices.

The whole setup is compatible with optical measurements, so it can be used in in-situ deposition during sample characterization. Since in quantum technologies, it is crucial to construct quantum devices and quantum chips in selected sample areas with special physical requirements, this method provides the unique tool to address this challenge.

Furthermore, compared to all the methods, the method is a noncontact method. It has the possibility to perform under complex environments such as the repair of microelectronics.

The cost of the device as well as the cost of the reagent are low. On top of it, with microfluid channels, it is possible to recycle the raw material, which further reduces the cost.

As can be seen form the above, here provided is a novel single-step and easy-to-adapt method that can deposit and etch materials in-situ. Its unique methodology is based on the semiconductor particle assisted photon induced chemical reaction and optical trapping. This mechanism can be used for depositing a large selection of materials including metals, insulators and magnets, with qualities on par with current technologies. Patterning with several materials together with optical-diffraction-limited resolution accuracy can be achieved from macroscopic to microscopic scale. Furthermore, the setup is naturally compatible with optical microscopy based measurements, thus sample characterisation and material deposition can be realised in-situ. Various devices fabricated with this method in 2D or 3D show it is ready for deployment in practical applications. This revolutionary method will provide a distinct tool in material technology.

BRIEF DESCRIPTION OF THE DRAWINGS

Further features, details and advantages of the disclosure result from the wording of the claims as well as from the following description of embodiments on the basis of the drawings.

DETAILED DESCRIPTION

In the following description as well as in the figures corresponding components and elements bear the same reference numbers. For the sake of clarity, not all reference numbers are shown in all figures.

Figure 1:
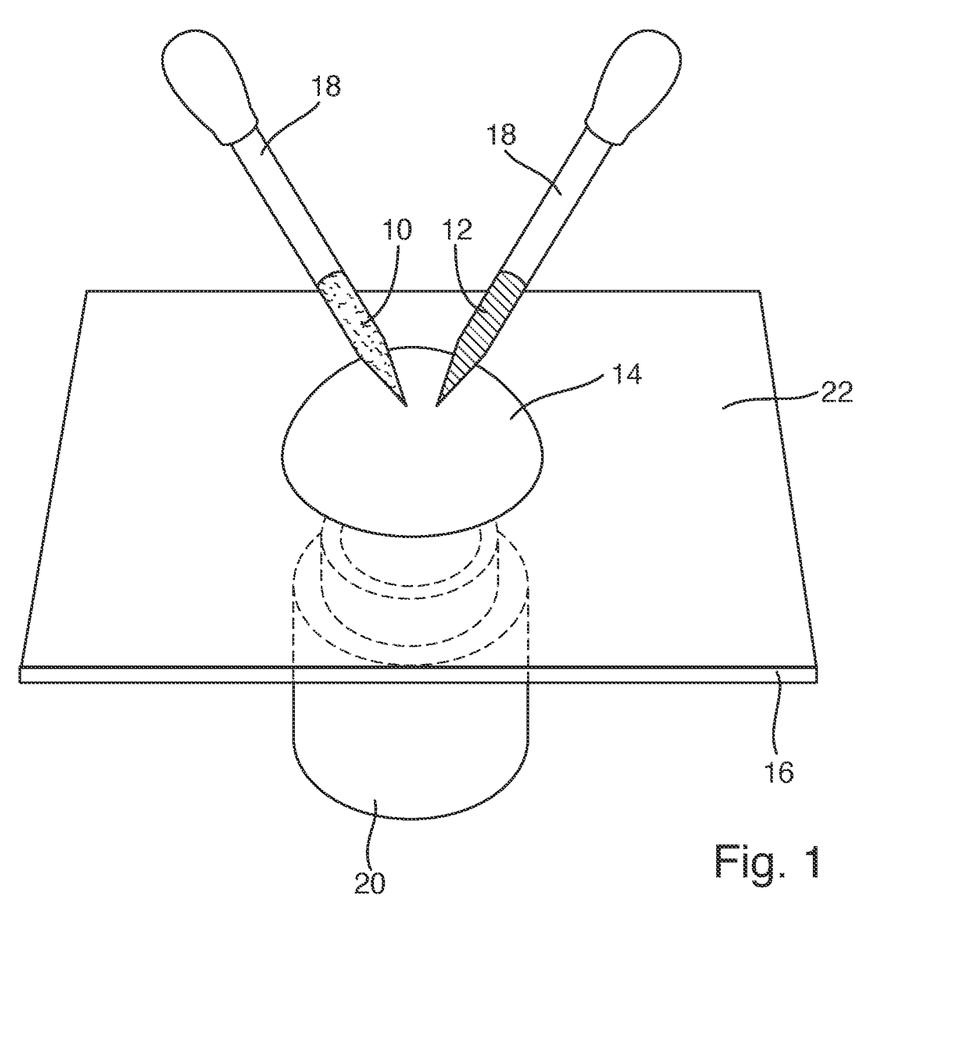
FIG. 1 shows a schematic presentation of apply a first solution and a second solution to form a reagent on a surface.
Figure 2:
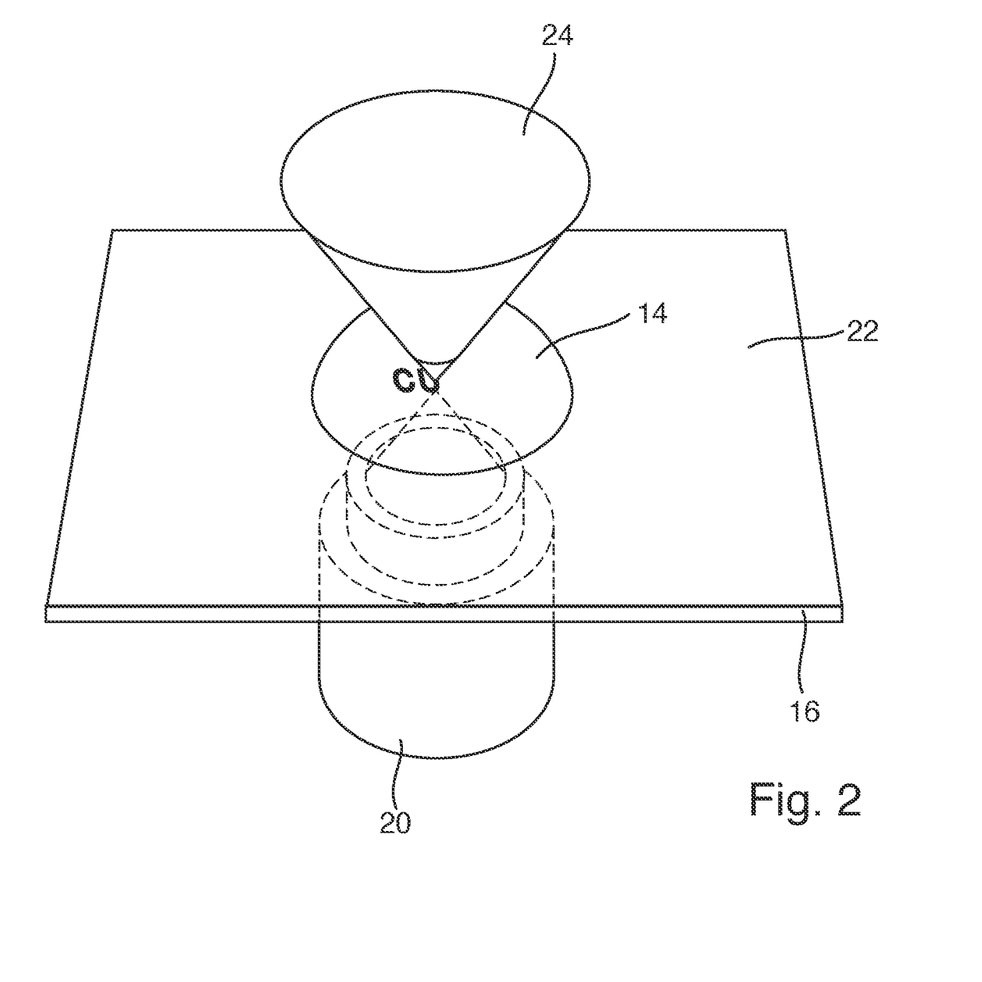
FIG. 2 shows a schematic presentation of deposition of material.
Figure 3:
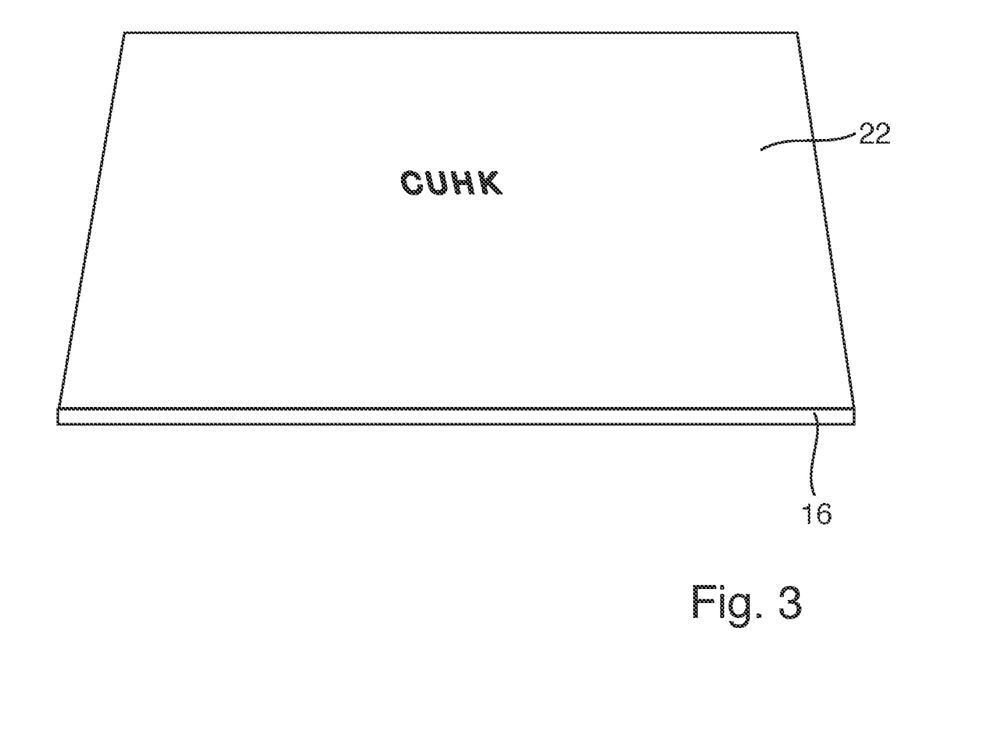
FIG. 3 shows a schematic presentation of the deposited material after removing the residue reagent.

FIGS. 1 to 3 illustrate the inventive method for a laser induced material deposition.

FIG. 1 shows a schematic presentation of apply a first solution 10 and a second solution 12 to form a reagent 14 on a substrate 16. In this case the first and the second solutions 10, 12 are each applied by the means of a pipette 18. The first solution 10 and the second solution 12 are chosen based on the material to be deposited.

Under the substrate 16 an objective lens 20 is arranged. A light source (not shown), in this case a cw laser, provide a laser beam (not shown), that is conducted through the objective lens 20. The objective lens 20 focus the laser beam on the reagent 14 on the surface 22 of the substrate 16.

FIG. 2 shows a schematic presentation of deposition of material. When the cw laser light is focused on the reagent 14, free electrons, excited from the valence band of the semiconductor nanoparticle by photons, trigger a chemical reduction process. This reduction process converts metal ions from the first solution 10 to metal particles on the surface of the semiconductor nanoparticle from the second solution 12. Simultaneously, the focused laser beam also works as an optical trap driving particles towards the focus spot on the substrate 16 surface 22. With the combination of these two mechanisms, the chemically-reduced metal growing on the surface of the particles works like a glue, bonding trapped particles together and also to the surface 22 of the substrate 16 to form a mechanically rigid deposition on the surface 22 of the substrate 16. The cone 24 shown in FIG. 2 shall represent the diverging laser beam. This is to illustrate the focus of the laser beam. The focus is moved across the surface 22 of the structure 16. There, where the focus has wandered along, the deposition of material occurs. By moving the focus away from the surface 22, a 3D-structure of the deposited material can be realised.

FIG. 3 shows a schematic presentation of the deposited material after removing the residue reagent 14. One can recognize the deposited material in form of the capital letters CUHK (The Chinese University of Hong Kong).

Figure 4:
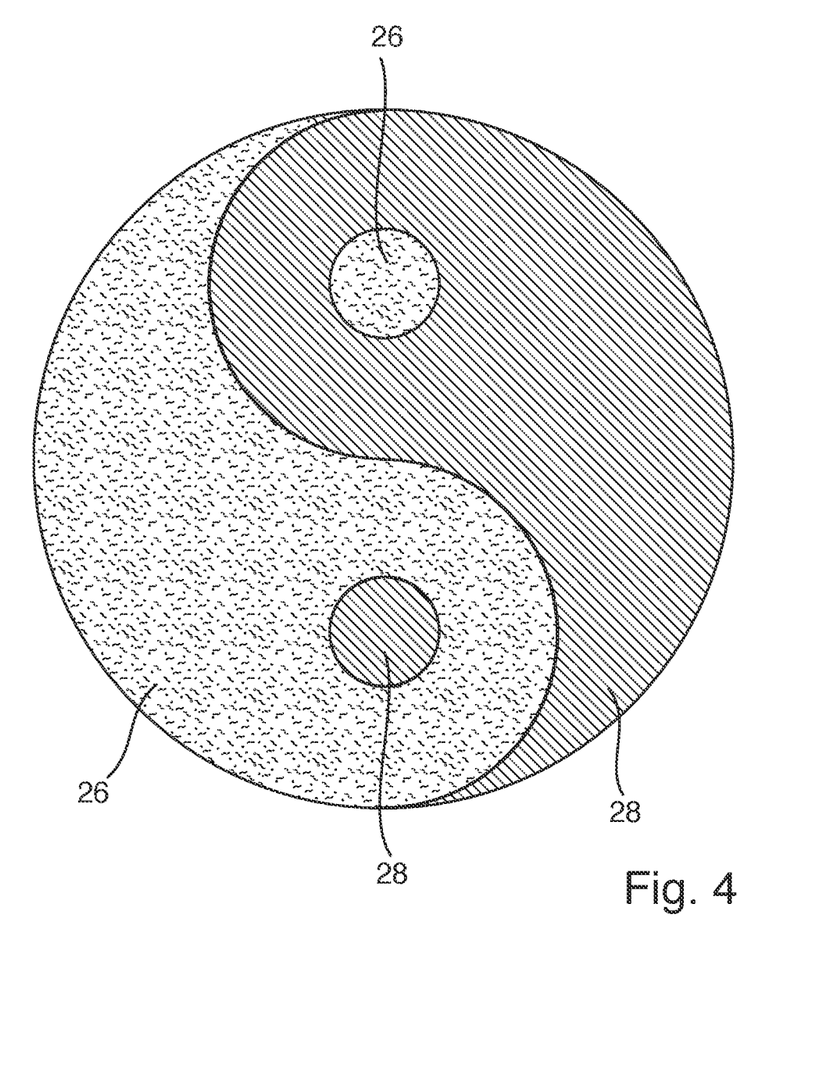
FIG. 4 shows an example of a pattern consisting of two different materials.

FIG. 4 shows an example of a pattern consisting of two different materials. Here a Yin-Yang-fish symbol was drawn with gold 26 and platinum 28.

Figure 5:
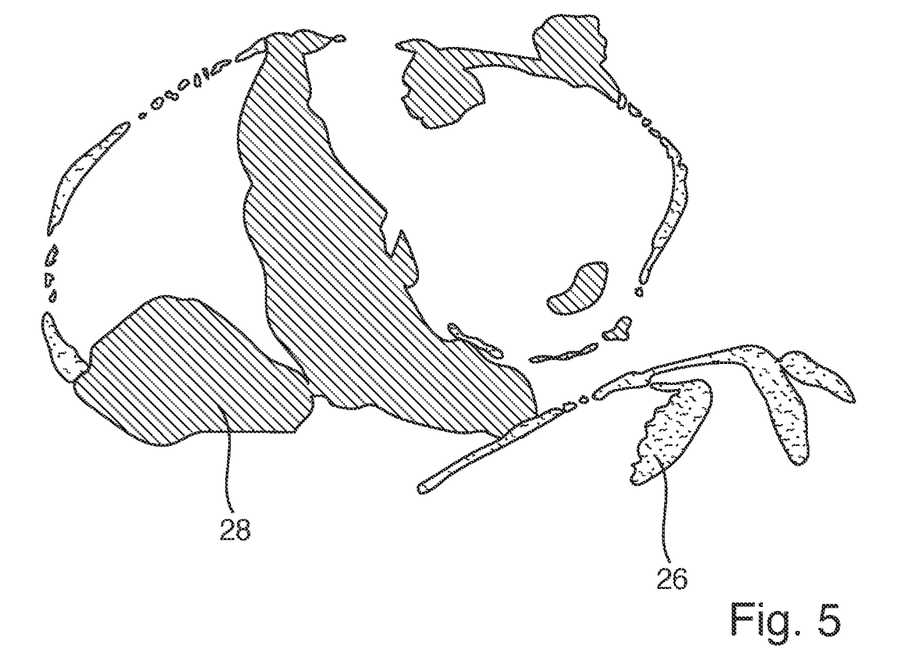
FIG. 5 shows another example of a pattern consisting of two different materials.

FIG. 5 shows another example of a pattern consisting of two different materials. The whole pattern is ca. 50 μm in size.

Here a panda with a bamboo branch was drawn. The dark body parts of the panda were drawn in platinum 28, and the rest, including the contour of the panda and the bamboo, were drawn in gold 26. This colouring is analogue to the colouring in FIG. 4. The nature colouring of gold is yellow, in the FIGS. 4 and 5 this yellow/golden colour is indicated by white areas with reference number 26.

The colour of the deposited material corresponds to the colour of metal whose metallate are dissolved in the first solution 10. For example, by using gold(III) chloride hydrochloride ($HAuCl_4$) as metallate in the first solution 10 the colour of the deposited material will be yellow or golden, as described above. As a further example, by using chloroplatinic acid ($H_2PtCl_6$) as matallate in the first solution 10 the colour will be black, as illustrated in FIGS. 4 and 5.

The colour of the semiconductor nanoparticles, it is black in the case of ink particles for example, does not matter. Because the metal ions attach themselves to the semiconductor nanoparticles and surround them, the semiconductor nanoparticles are at the end covered by the attached metal ions respectively metal atoms. Therefore, the colour of the covered nanoparticles is not seen in the deposited material.

Figure 6:
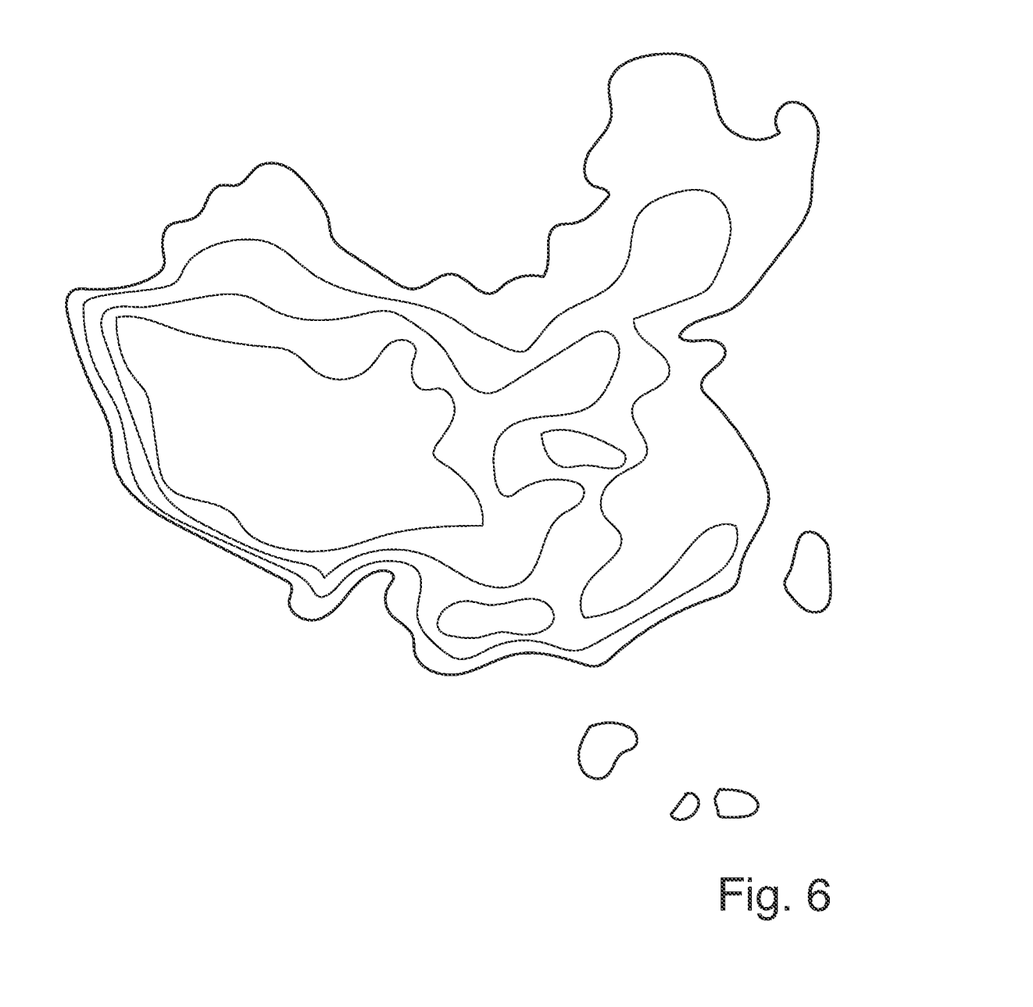
FIG. 6 shows a top view on a 3D-pattern produced by the inventive method.

FIG. 6 shows a top view on a 3D-pattern produced by the inventive method. The shown 3D-pattern is ca. 200 μm in size. A topographic map of China is seen made by iron oxide deposition.

Figure 7:
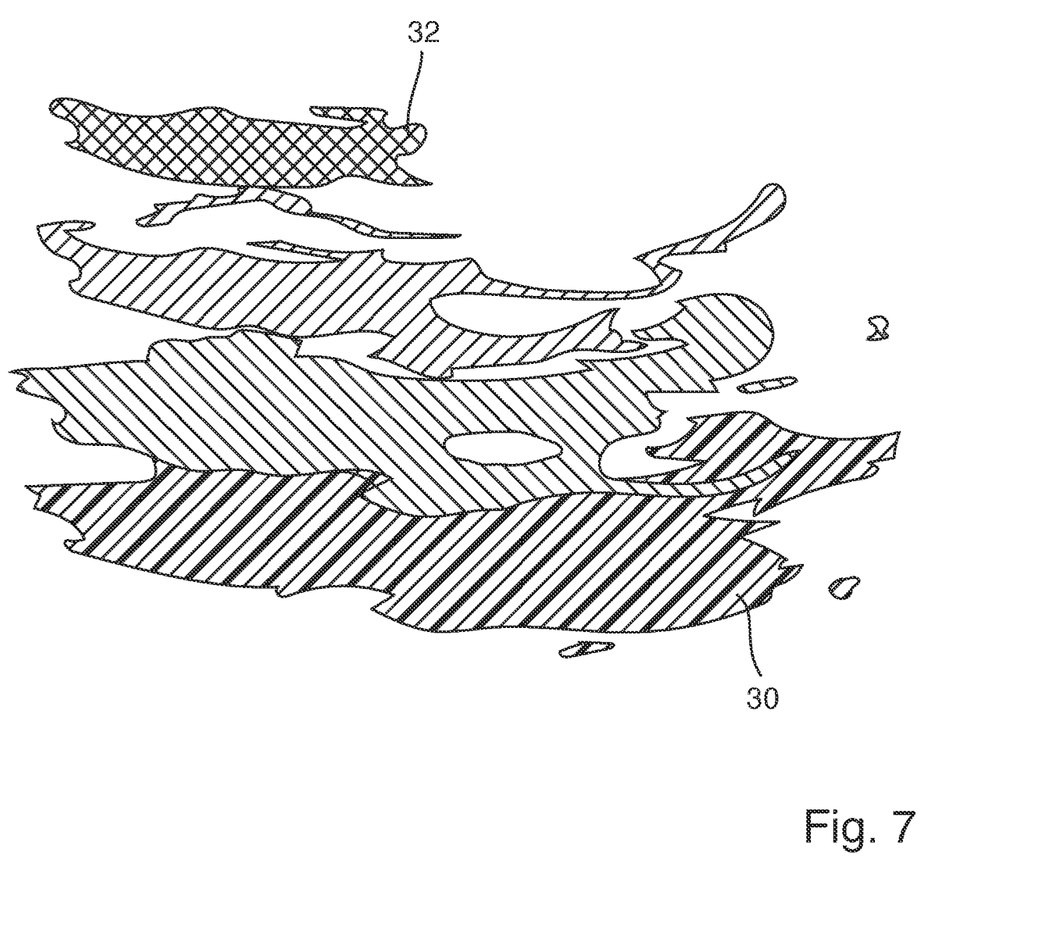
FIG. 7 shows a schematic structure in layers of the 3D-pattern according to FIG. 6.

FIG. 7 shows a schematic structure in layers of the 3D-pattern according to FIG. 6. Each layer represents a certain high in the topographic structure. The lowest layer 30 corresponds to the map of China. The top layer 32 corresponds to the highest regions of China and represents the area around the Himalaya. For each layer the focus of the laser light source is adjusted in that way, that the distance between the focus and the surface 22 of the substrate 16 is for each layer different. This distance of the focus from the surface 22 of substrate 16 increases with each additional layer. Of course, the distance between the surface 22 of the substrate 16 and the focus is kept the same within the same layer.

In the following, an example for the inventive method, the deposition of platinum on glass is described. A glass substrate 16 covered with an aqueous reagent 14 of the mixture of H2PtCl6 and carbon ink was subjected to the laser writing system. A cw laser beam was focused at the substrate 16 surface 22 respectively the liquid reagent 14 to introduce the reduction reaction between metallate and semiconductor nanoparticles as well as inducing optical trapping. The laser on/off status was controlled by an acousto-optic modulator (AOM), while the transmission, and luminescence/scattering at the laser focus were imaged by the same objective lens 20/microscope.

The parameters for large structures were the following: The exposure laser power was 60.4 mW measured in front of the objective lens 20. The exposure time per pixel was 30 ms, and the pixel size was 1.17 μm. For microstructure deposition, the exposure parameter was 0.485 mW power and 1 s exposure time. After the exposure, the residue reagent 14 was taken out by a pipette. Further cleaning was performed by adding and taking out pure water solution 2 to 3 times. All the procedures had been done without taking out the sample from the set up system. When the deposition of a second type of material is needed, the steps, described above, can be repeated using a different first solution 10.

In other experimental attempts of the inventive method, the exposure parameters were the following:

Parameters for a thin iron (Fe) line: the first solution 10 with FeCl3 with the concentration of 25 mmol/L, and 200 times diluted hero ink (the second solution 12) were mixed by 1:1 volume ratio. The mixture/reagent 14 was sonicated for 15 s. Exposure parameters: 0.485 mW laser power, 100 magnification NA(Numerical aperture)=1.3 oil objective lens 20, exposure time 1 s per pixel, step size 0.35, pixel size 446 nm.

Parameters for metal microstructure: The receipt for each metal was as following: 15 mmol/L $H_2PtCl_6$, 1.25 mmol/L $HAuCl_4$, 50 mmol/L $FeCl_3$, 7 mmol/L $AgNO_3$. These metal solutions (the first solutions 10) were then mixed with 3000 times diluted from the off-the-shelf carbon ink (the second solution 12) by 1:1 volume ratio. 100 mmol/L $NiCl_2$ was mixed with 3000 times diluted off-the-shelf carbon ink (second solution 12) by 1:1 volume ratio. All reagents 14 were sonicated for 15 s. Exposure parameter: 57.6 mW laser power, 20×NA=0.75 objective lens 20, exposure time 30 ms per pixel, step size 0.15, pixel size 1.17 μm.

The inventive method can be used to deposit ferromagnetic materials as well. Take nickel as an example. In an experiment, four square shaped Ni layers with a permanent magnet polarizing them during the deposition process were wrote. The magnetic profile then was measured with nitrogen vacancy (NV) centers inside diamond nanoparticles spread on the sample. The splitting of electron spin resonance (ESR) lines from these NV centers are due to the Zeeman effect of the residue magnetic field from the Ni layers. The field is nearly 30 Gauss inside the Ni square while close to none outside. This implies the ferromagnetic property in the deposited layer. Thus, this method enables to in-situ fabricate micromagnets and complicated magnetic structures.

The performance of the deposited materials can be further demonstrated in application devices. Flexible electronics and wearable technology are booming fields. Simplification in production and flexibility in design can be key factors for commercial developments. The direct laser writing nature of the present method provides a simple and cheap way for production and customization. As examples, two proof-of-principle devices were build: a resistive flex sensor and a resistive touch sensor. Resistive flex sensors are important parts for robotics. For this, a platinum line with length of 300 µm and width of 50 µm was written on a polyimide tape. The measured resistance of the wire shows a linear dependency with the curvature. The device reaches similar sensitivity, than current sensors, but is two orders of magnitude smaller in size.

From this deformation-sensitive mechanism, resistive touch sensor devices can be further developed. As another example, two parallel platinum squares were written on a polyimide tape. Depending on the location where pressure was applied on, the measured resistances of both lines show different trend of change. Based on this dependence, a measurement of both resistances can determine the location of the touching.

Beside applications in macroscopic scale, with the present method also devices for microscopic applications can be fabricated with submicron accuracy. One of the major road blocks for nanotechnology is manufacturing high performance devices with high precision with respect to tiny samples. The present method provides an easy solution as the deposition and imaging are in-situ. One key device in solid state based quantum information science is the microwave waveguide, which is used to enhance coupling of microwave radiation to solid state qubits. This waveguide has to be in close vicinity to the tiny qubits and it should be able to transmit high power microwave signals. In an experiment directly a microwave waveguide near a nanodiamond particle was wrote. This waveguide performs as good as structures made with conventional method. This was proven in an electron spin Rabi oscillation measurement. With a cross-section of only 27×2 µm$^2$, this structure works well for a large power range. The measured linear dependency of the Rabi frequency to the square root of the applied microwave power up to 6.2 Watts. Furthermore, since the laser writing setup is compatible with other confocal microscope setups, it is possible to combine both the sample characterization measurements and the present method together. This would greatly benefit the research fields where a big variation of the sample properties are unavoidable, such as two-dimensional materials, nanoparticles and nanostructures.

What is claimed is:

1. Method for a photon induced material deposition comprising the following steps:
   providing a first solution, which contains metallate or metal ions, selected from the group consisting of gold (III) chloride hydrochloride ($HAuCl_4$), zinc chloride ($ZnCl_2$), nickel chloride ($NiCl_2$), chloroplatinic acid ($H_2PtCl_6$), silver nitrate ($AgNO_3$),
   providing a second solution, which contains light sensitive reducing agent, selected from the group consisting of graphene oxide, quantum dots, and carbon ink particles,
   mixing the first solution and the second solution to form a reagent on a substrate, and
   focusing a light source on the reagent to form a mechanically rigid deposition in the focus of the light source.

2. Method for a photon induced material processing comprising the following steps:
   providing a first solution, which contains photoacid, metallate or metal ions, selected from the group consisting of gold(III) chloride hydrochloride ($HAuCl_4$), zinc chloride ($ZnCl_2$), nickel chloride ($NiCl_2$), chloroplatinic acid ($H_2PtCl_6$), silver nitrate ($AgNO_3$),
   providing a second suspension, which contains light sensitive reducing agent, selected from the group consisting of graphene oxide, quantum dots, and carbon ink particles,
   mixing the first solution and the second suspension to form a reagent on a substrate, and
   focusing a light source on the reagent to either form a mechanically rigid deposition in the focus of the light source or etch the materials.

3. Method according to claim 1, wherein the method comprises at least one of the following features:
   the light source is a continuous wave laser or a pulsed laser in the visible range, optionally with 532 nm wavelength;
   the focus of the light source is moved across the substrate and/or can be moved away from the substrate to form a two- or three-dimensional deposition;
   the light source is focused by a lens, optionally an air objective lens or an oil objective lens or a water immersion objective lens; and/or
   the light from the light source is guided to the reagent via free space, and/or via at least photonic waveguide and/or via at least one optical fiber and/or via evanescent coupling.

4. Method according to claim 2, wherein the first solution contains photoacid generators (PAGs) and photoacids (PAHs).

5. Method according to claim 1, wherein the substrate is glass, quartz, sapphire, indium tin oxide or polyimide tape.

6. Method according to claim 1, wherein the deposition is a solid and rigid composite made of semiconductor particles and inorganic material.

7. Method according to claim 1,
   wherein after forming a deposition the method can be repeated,
   wherein the first solution is replaced by a third solution, which contains metallate or metal ions, which are different from the metallate or metal ions of the first solution, and/or the second solution is replaced by a fourth solution, which contains light sensitive reducing agent comprising semiconductor nanoparticles, which are different from light sensitive reducing agent comprising semiconductor nanoparticles of the second solution.

8. Method according to claim 1, wherein the method comprises further the step:
   sintering or annealing the deposited material to improve its mechanical and/or electronic properties.

9. Method according to claim 2, wherein the reagent is applied by drop-casting, and/or by spin-coating, and/or by spraying, and/or by microfluidic channels, and/or by ink injections.

10. Method according to claim 2, wherein by inducing decomposition solution on the semiconductor particle after the deposition, a deposition with pure materials is created.

11. Method according to claim 1, wherein the method is used for making electronics, fabricating flexible devices and/or quantum devices, and/or photonic structures, and/or repairing broken pad and circuits, optionally with a printer.

12. Method according to claim 2, wherein the method comprises at least one of the following features:
   the light source is a continuous wave laser or a pulsed laser in the visible range, optionally with 532 nm wavelength;

the focus of the light source is moved across the substrate and/or can be moved away from the substrate to form a two- or three-dimensional deposition;

the light source is focused by a lens, optionally an air objective lens or an oil objective lens or a water immersion objective lens; and/or the light from the light source is guided to the reagent via free space, and/or via at least photonic waveguide and/or via at least one optical fiber and/or via evanescent coupling.

13. Method according to claim 2, wherein the substrate is glass, quartz, sapphire, indium tin oxide or polyimide tape.

14. Method according to claim 2, wherein the method comprises further the step:

sintering or annealing the deposited material to improve its mechanical and/or electronic properties.

15. Method according to claim 2, wherein the method is used for making electronics, fabricating flexible devices and/or quantum devices, and/or photonic structures, and/or repairing broken pad and circuits, optionally with a printer.

* * * * *